(12) United States Patent
Zheng et al.

(10) Patent No.: US 6,885,590 B1
(45) Date of Patent: Apr. 26, 2005

(54) MEMORY DEVICE HAVING A P+ GATE AND THIN BOTTOM OXIDE AND METHOD OF ERASING SAME

(75) Inventors: Wei Zheng, Santa Clara, CA (US); Chi Chang, Redwood City, CA (US); Tazrien Kamal, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 240 days.

(21) Appl. No.: 10/341,881

(22) Filed: Jan. 14, 2003

(51) Int. Cl.$^7$ .............................................. G11C 16/04
(52) U.S. Cl. .............................. 365/185.29; 365/185.18
(58) Field of Search ....................... 365/185.29, 185.18, 365/185.27, 185.3, 185.33

(56) References Cited

U.S. PATENT DOCUMENTS

| | | | |
|---|---|---|---|
| 5,311,049 A | 5/1994 | Tsuruta ....................... 257/324 |
| 5,612,547 A | 3/1997 | Clarke et al. .................. 257/77 |
| 5,774,400 A | * 6/1998 | Lancaster et al. ......... 365/185.3 |
| 5,888,867 A | 3/1999 | Wang et al. ................. 438/257 |
| 6,137,718 A | 10/2000 | Reisinger ............... 365/185.03 |
| 6,215,702 B1 | 4/2001 | Derhacobian et al. . 365/185.29 |
| 6,265,268 B1 | 7/2001 | Halliyal et al. ............. 438/261 |
| 6,348,420 B1 | 2/2002 | Raaijmakers et al. ........ 438/769 |
| 6,456,533 B1 | 9/2002 | Hamilton et al. ....... 365/185.22 |
| 6,671,209 B1 | * 12/2003 | Lin et al. ................ 365/185.29 |
| 6,720,614 B1 | * 4/2004 | Lin et al. ..................... 257/316 |
| 6,724,661 B1 | * 4/2004 | Lee et al. .............. 365/185.29 |

FOREIGN PATENT DOCUMENTS

WO          98 06138          2/1998

OTHER PUBLICATIONS

Reisinger H. et al., "A Novel Sonos Structure for Nonvolatile Memories with Improved Data Retention", 1997 Symposium on VLSL Technology Digest of Technical Papers, Jun. 10, 1997, pp. 113–114.

* cited by examiner

*Primary Examiner*—Anh Phung
(74) *Attorney, Agent, or Firm*—Renner, Otto, Boisselle & Sklar, LLP (57) ABSTRACT

A non-volatile memory device includes a semiconductor substrate and an N-type source and drain within the substrate. An oxide-nitride-oxide (ONO) stack is formed over the substrate. The ONO stack includes a thin bottom oxide layer. A P+ polysilicon electrode is formed over the ONO stack. The memory device is operative to perform a channel erase operation in which a pair of charge storing cells with the nitride layer are erased simultaneously.

9 Claims, 5 Drawing Sheets

MEMORY DEVICE HAVING A P+ GATE AND THIN BOTTOM OXIDE AND METHOD OF ERASING SAME

TECHNICAL FIELD

The present invention relates generally to the field of non-volatile memory devices and, more particularly, to a semiconductor/oxide-nitride-oxide on semiconductor (SONOS) type electrically erasable programmable read only memory (EEPROM) having a P+ gate and a thin bottom oxide layer and an improved channel erase method.

BACKGROUND

A pervasive trend in modem integrated circuit manufacture is to increase the number of bits stored per unit area on an integrated circuit memory core that contains memory devices (sometimes referred to as memory cells), such as flash electrically erasable programmable read only memory (EEPROM) devices. For instance, a conventional semiconductor/oxide-nitride-oxide on semiconductor (SONOS) type memory device is capable of storing two bits of data in "double-bit" format. That is, one bit can be stored using a memory cell on a first side of the memory device and a second bit can be stored using a memory cell on a second side of the memory device.

An exemplary non-volatile SONOS-type memory device includes a semiconductor substrate with a source and a drain (both typically having N-type conductivity) formed therein. A body is formed between the source and the drain. An oxide-nitride-oxide (ONO) stack is formed above the body. A gate electrode, which typically comprises an N or N+ polysilicon layer, is formed over the ONO stack. The ONO stack includes a first or bottom dielectric layer (often referred to as a bottom tunnel oxide), a charge storing nitride layer, and a second or top dielectric layer.

Programming of such a SONOS device can be accomplished, for example, by hot electron injection. Hot electron injection involves applying appropriate voltage potentials to each of the gate, the source, and the drain of the SONOS memory device for a specified duration until the charge storing layer accumulates charge. Such a process, with respect to a NOR architecture SONOS device is disclosed in co-owned U.S. Pat. No. 6,215,702, which is incorporated herein by reference in its entirety.

A conventional SONOS-type memory device, (e.g., having n N-type gate electrode and bottom oxide having a thickness of about 70 Å–100 Å), can only be erased using the conventional technique of "hot hole injection" (sometimes referred to as band-to-band (BTB) hot hole injection). In hot hole injection, a gate voltage of approximately –4—–8 volts is applied along with a drain voltage on the order of 4.5–6.0 volts, while the source is floated or grounded to erase one of the memory cells (typically the normal bit). Conversely, the complementary bit cell is erased by floating the drain and applying the appropriate voltage to the source and the gate. With such erase conditions, a BTB tunnel current is created under the gate. Holes are generated under these conditions and accelerate from the N-type drain region into the P-type body. The generated holes are accelerated in the electrical field created near the P-N drain/body junction. Some of the accelerated holes surmount the oxide to silicon interface between the substrate and the bottom oxide and are injected into the nitride layer to displace electrons (e.g., by recombination) and erase the cell. However, as these hot holes bombard the interface between the substrate and the bottom tunnel oxide, the interface as well as the bottom tunnel oxide are damaged causing undesirable interface states and degraded reliability over program/erase cycling.

Another erase mechanism is channel erase (also commonly referred to as a Fowler-Nordheim (FN) erase). Typically, in conventional SONOS-type devices, the top and bottom oxides have the same dielectric constant, resulting in the vertical fields during the erase being the same across both the top and bottom oxides. Therefore, during an FN channel erase, electrons are pushed out from the charge storing layer to the substrate. However, because of the required erase voltage, electrons also flow from the N+ gate through the top oxide into the charge storing layer at approximately the same tunneling rate. Therefore, while there is a net current from the control gate to the substrate, charge is not erased effectively from the charge storing layer.

An attempt has been made to use channel erase with a SONOS-type architecture memory device having a very thin bottom tunnel oxide layer, (i.e., 30 Å or less). While less bottom oxide damage may occur with this erase mechanism, SONOS devices having a very thin bottom tunnel oxide suffer from data retention issues due to this thin bottom oxide. Of course, one of the most important concerns with EEPROM cells is data retention capability. Data retention is defined as the length of time a particular cell can retain information stored in the form of charge on the charge storing layer. Devices with very thin bottom oxide layers are susceptible to "low voltage leakage current," which arises when electrons within the charge storing layer traverse the bottom tunnel oxide when no voltage is applied to the device. This small amount of leakage current may ultimately lead to total discharge of the cell.

Accordingly, there is an ever increasing demand for a SONOS-type memory device, which can be erased effectively, while still maintaining data retention capability.

SUMMARY OF THE INVENTION

According to one aspect of the invention, the invention is directed to a memory device. The memory device includes a semiconductor substrate, an N-type conductivity source, and an N-type conductivity drain formed on opposite sides within the semiconductor substrate, such that the source drain defined a body region therebetween. A bottom dielectric layer is formed over the semiconductor substrate. A charge storing layer is formed over the bottom dielectric layer. The charge storing layer has a conductivity such that a first charge can be stored in a first charge storing cell adjacent the source and a second charge can be stored in a second charge storing cell adjacent the train. A top dielectric layer is formed over the charge storing layer and a P+ polysilicon gate layer is formed over the top dielectric layer.

According to another aspect of the invention, the invention is directed to a method of performing an erase operation on a non-volatile memory device. The device can include an N+ source and an N+drain within a substrate. The device can include a bottom oxide on a top surface of the substrate, a charge storing layer on the bottom oxide layer, a top oxide layer on the charge storing layer, and a P+ polysilicon gate electrode on the top oxide. The memory device can be programmed by storing charge in a portion of the charge storing layer adjacent the source. The method includes applying a negative erase voltage to the gate electrode, connecting the drain to a zero potential or floating the drain, connecting the source to a zero potential or floating the source, and connecting the substrate to a zero potential.

According to another aspect of the invention, the invention is directed to a method of simultaneously erasing two charge storing cells on a non-volatile memory device. The device can include an N+ source and an N+ drain within a P-type substrate, an oxide-nitride-oxide (ONO) stack on a top surface of the substrate, where the charge storing cells are disposed within the nitride layer of the ONO stack, and a gate layer on the ONO stack. The method includes increasing a potential barrier height of the top oxide of the ONO stack, where the increased potential barrier height is effective to decrease the probability that, during an erase operation, electrons within the gate layer will overcome a potential barrier of the top oxide and become trapped in the charge storing cells of the nitride layer. The method further includes decreasing a barrier width of the bottom oxide of the ONO stack, where the decreased barrier width is effective to (i) increase the probability that, during an erase operation, electrons within the charge storing cells of the nitride layer will overcome a potential barrier of the bottom oxide to exit the charge storing cells, and (ii) decrease the probability that, during operations other than an erase operation, charge will overcome a potential barrier of the bottom oxide and escape from the charge storing cells. A negative erase voltage of less than about −20 volts is applied to the gate layer, a zero potential is applied to the source or the source is floated, a zero potential is applied to the drain or the drain is floated, and a zero potential is applied to the substrate.

BRIEF DESCRIPTION OF DRAWINGS

These and further features of the present invention will be apparent with reference to the following description and drawings, wherein.

DISCLOSURE OF INVENTION

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

Figure 1:
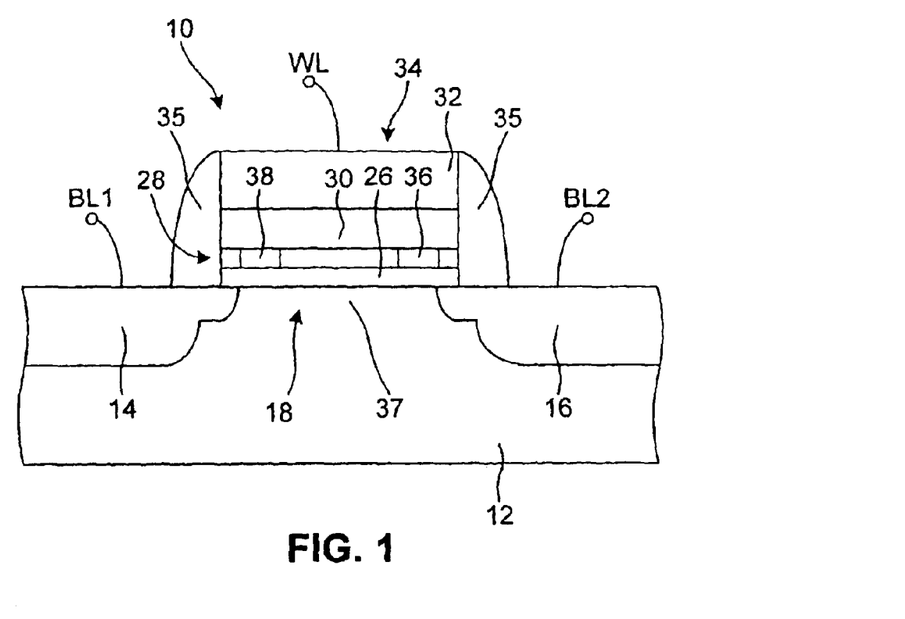
FIG. 1 is a schematic cross-section illustration of a SONOS-type memory device in accordance with the present invention.

With reference to FIG. 1, an embodiment of a "double-bit", semiconductor/oxide-nitride-oxide on semiconductor (SONOS) type, non-volatile, flash electrically erasable programmable read only memory (EEPROM) memory device 10 is illustrated. The memory device 10 includes a semiconductor substrate 12. In one embodiment, the substrate 12 can initially be doped to have P-type conductivity (e.g., P dopant concentration). Within the substrate 12, an N-type conductivity (e.g., N+dopant concentration) source 14 and an N-type conductivity (e.g., N+dopant concentration) drain 16 are formed.

A body 18 is formed between the source 14 and the drain 16. The body 18 can have the dopant type and concentration as the initial doping of the substrate 12. The substrate 12, the source 14, the drain 16 and the body 18 can be formed, for example, from a semiconductor such as appropriately doped silicon, germanium or silicon-germanium.

Above the body 18 is a dielectric layer (also referred to as a tunneling oxide layer or bottom dielectric layer 26) that is made from, for example, silicon oxide ($SiO_2$), other standard-K material (e.g., having a relative permittivity below ten) or a high-K material (e.g., having a relative permittivity, in one embodiment above ten, and in one embodiment above twenty).

Over the bottom dielectric layer 26 is a charge trapping layer (also referred to as a charge storing layer 28). The charge storing layer 28 can be made from, for example, a non-conductive material including silicon nitride ($Si_3N_4$), silicon oxide with varied polysilicon islands, implanted oxide and the like.

Over the charge storing layer 28 is another dielectric layer (also referred to as a top dielectric layer 30) made from a material such as, for example, silicon oxide, other standard-K material or a high-K material. Over the top dielectric layer 30 is a gate electrode 32 made from, for example, polycrystalline silicon. Preferably, the gate electrode 32 has a P+ dopant concentration, the advantages of which will be discussed more fully below.

The gate electrode 32, the top dielectric layer 30, the charge storing layer 28 and the bottom dielectric layer 26 form a gate stack 34. Sidewall spacers 35 can be disposed adjacent lateral sidewalls of the gate stack 34 for use in controlling dopant implantation. A work function of the gate stack 34 controls a channel 37 within the body 18. As is understood in the art, the channel 37 extends from the source 14 to the drain 16.

In one embodiment, the bottom dielectric layer 26 has a thickness that is less than the thickness of the top dielectric layer 30. For example, the bottom dielectric layer 26 can have a thickness of about 40 Å to about 60 Å, while the top dielectric layer can have a thickness between about 100 Å–120 Å. As is described more fully below, the thickness of the bottom dielectric layer facilitates effective FN or channel erasing, while remaining thick enough to prevent low voltage leakage current and facilitate desirable data retention. In one embodiment, the charge storing layer 28 has a thickness of about 50 Å to about 70 Å. As is discussed more fully below, the thickness of the bottom dielectric layer 26, coupled with the P+ gate electrode 32 results in significant advantages with respect to erasing of the charge storing cells.

The memory device 10 is operatively arranged to be programmed, read and erased by the application of appropriate voltage potentials to each of the gate electrode 32, the source 14 and the drain 16. More specifically, the gate electrode 32 can be coupled to a word line (WL), the source 14 can be coupled to a first bit line (BL1) and the drain 16 can be coupled to a second bit line (BL2) for applying the various voltage potentials to the corresponding components of the memory device 10.

In one embodiment, the memory device 10 can be configured as a virtual ground device. That is, the memory device 10 is connected in series with adjacent memory devices (not shown) such that the source 14 can be formed from a conductive region that also forms a drain of the adjacent memory device. Similarly, the drain 16 can be formed from a conductive region that also forms the source of a memory device (not shown) disposed adjacent the drain 16 side of the memory device 10. It is noted that the source and drain of adjacent memory devices need not be formed from a single conductive region, but can be formed from separate structures that are electrically connected together (e.g., a pair of conductive regions spaced apart by a trench isolation region and connected by a conductive layer, such as silicide).

As will become more apparent from the discussion below, within the charge storing layer 28, the memory device 10 includes a first charge storing region or cell (also referred to herein as a first cell or normal bit 36) adjacent the drain 16 and a second charge storing region or cell (also referred to herein as a second cell or complementary bit 38) adjacent the source 14.

In the illustrated embodiment, the memory device 10 is a symmetrical device allowing for programming, reading and erasing of the first cell 36 and the second cell 38 by respectively switching the rules of the source 14 and drain 16 during those operations. Accordingly, the terms source and drain can be used interchangeably depending upon which of the normal bit 36 or complementary bit 38 is being programmed, verified, read or erased.

With continued reference to FIG. 1, programming of the charge storing cells 36 and 38 from a blank state (e.g., representing a binary value of "1") to a charged state (e.g., representing a binary value of "0") can be carried out using conventional techniques. It is noted that the blank state corresponds to an amount of charge being stored by the charge storing cell 36, 38 that, during a read operation, would place a threshold voltage (Vt) of the memory cell 10 equal to or less than an erase threshold voltage. The programmed state corresponds to an amount of charge being stored by the charge storing cell 36, 38 that, during the read operation, would place the threshold voltage of the memory cell 10 within a threshold voltage distribution that is higher than the erase threshold voltage. In one embodiment, the memory cell 10 can be programmed using multi-level cell (MLC) programming. MLC programming can be accomplished by programming each charge storage cell 36, 38 with an amount of charge selected from one of a plurality of distinguishable amounts of charge, referred to as program levels.

In one embodiment, the programming technique involves hot electron injection. However, other programming techniques, such as hot hole injection, carrier tunneling and so forth are meant to fall within the scope of the present invention.

Using the hot electron injection technique to program the first charge storing cell 36, appropriate voltage potentials are applied to the source 14, drain 16 and/or the gate electrode 32. The applied potentials generate a vertical electric field through the dielectric layers 26, 30 and the charge storing layer 28 and a lateral electric field along the length of the channel 18 from the source 14 to the drain 16.

The lateral electric field causes electrons to be drawn off the source 14 and begin accelerating toward the drain 16. As the electrons move along the length of the channel 37, the electrons gain energy and upon attaining enough energy, the electrons are able to jump over the potential barrier of the bottom dielectric layer 26 and into the charge storing layer 28 where the electrons become trapped.

The probability of electrons jumping the potential barrier is a maximum in the area of the first charge storing cell 36 adjacent the drain 16, where the electrons have gained the most energy. These accelerated electrons are termed hot electrons and once injected into the charge storing layer 28, stay in the first charge storing cell 36 of the charge storing layer 28. The trapped electrons tend not to spread through the charge storing layer 28 due to this layer's low conductivity and low lateral electric field therein. Thus, the trapped charge remains in the localized trapping region the first charge storing cell 36 close to the drain 16.

The foregoing technique to program the first charge storing cell 36 can be used to program the second charge storing cell 38, but the functions of the source 14 and the drain 16 are reversed. More specifically, appropriate voltages are applied to the source 14, the drain 16 and/or the gate electrode 32 such that the drain 16 functions as a source of electrons that travel along the channel 37 from the drain 16 towards the source 14. Accordingly, the terms source and drain can be used interchangeably. As the electrons move along the length of the channel 37, the electrons gain energy and upon attaining enough energy, the electrons are able to jump over the potential barrier of the bottom dielectric layer 26 and into the charge storing layer 28 where the electrons become trapped. The probability of the hot electrons jumping the potential barrier is a maximum in the area of the first charge storing cell 36 adjacent the source 14, where the electrons have gained the most energy.

Table 1 includes exemplary voltage potentials and pulse durations that can be applied to the gate electrode 32, the source 14 and the drain 16 to program the charge storage regions 36, 38. It is noted that the values presented in table 1 will vary depending on the specific characteristics of the memory device 10 being programmed.

TABLE 1

|  | Gate Voltage | Source Voltage | Drain Voltage | Pulse Length |
| --- | --- | --- | --- | --- |
| First Cell | 9–10 volts | 0 volts | 4–6 volts | 1 µs |
| Second Cell | 9–10 volts | 4–6 volts | 0 volts | 1 µs |

Verifying the programming of the memory device 10 and reading of the memory device 10 can be carried out using conventional techniques. For example, the charge storing cells 36, 38 can be read in a reverse direction with respect to the direction of programming.

In the illustrated embodiment, erasing of the charge storing cells 36, 38 can be accomplished using a channel erase operation utilizing Fowler-Nordheim (FN) tunneling. As is described more fully below, this channel erase operation is possible because of the structural features of the memory device 10. For example, the use of a heavily doped $P^+$ gate electrode 32 sufficiently eliminates back tunneling from the gate electrode 32, across the top dielectric layer 30, into the charge storing layer 28. In addition, use of a reduced thickness bottom dielectric layer 26 facilitates weak direct tunneling across the bottom dielectric layer 26, while still preserving data retention capability.

In one embodiment, both charge storing cells are erased simultaneously by applying a negative gate erase voltage to the gate electrode 32 and grounding the source 14, drain 16, and substrate 18. In one embodiment, a relatively large negative gate erase voltage (e.g., about −20 volts) is applied to the gate electrode 32. Alternatively, smaller negative gate erase voltages (e.g., between about −4 volts to about −10 volts) may be applied. In another embodiment, the gate voltage is about −15 volts to about −20 volts, while the source and drain are floated or grounded and the substrate is grounded. Alternatively, in an embodiment in which the memory device sits in an isolated P-well within the substrate, a negative gate erase voltage of about −5 volts to about −10 volts is applied in conjunction with a positive P-well voltage of about +5 volts to about +10 volts with the source and drain left to float.

Figure 2:
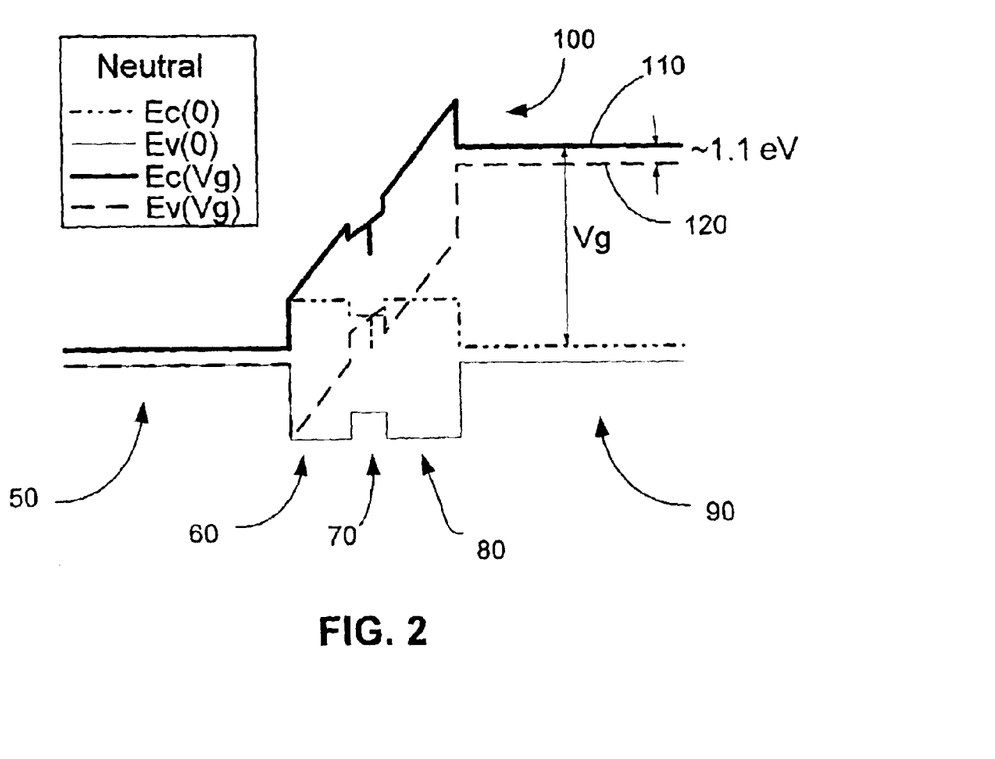
FIG. 2 is a neutral state energy band diagram of a SONOS-type memory device having a P+ gate in accordance with one embodiment of the present invention.
Figure 3:
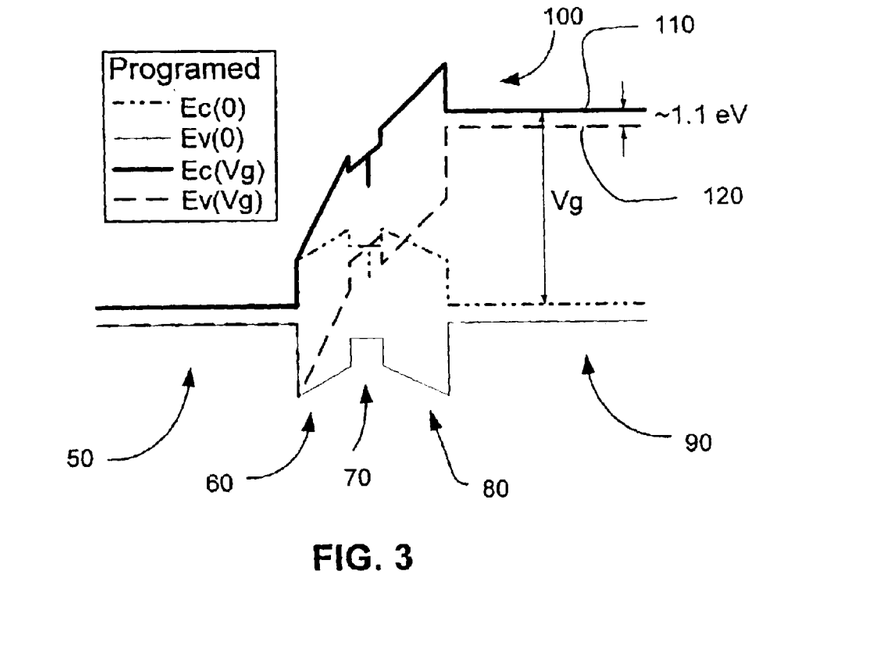
FIG. 3 is a programmed state energy band diagram of a SONOS-type memory device having a P+ gate in accordance with one embodiment of the present invention.
Figure 4:
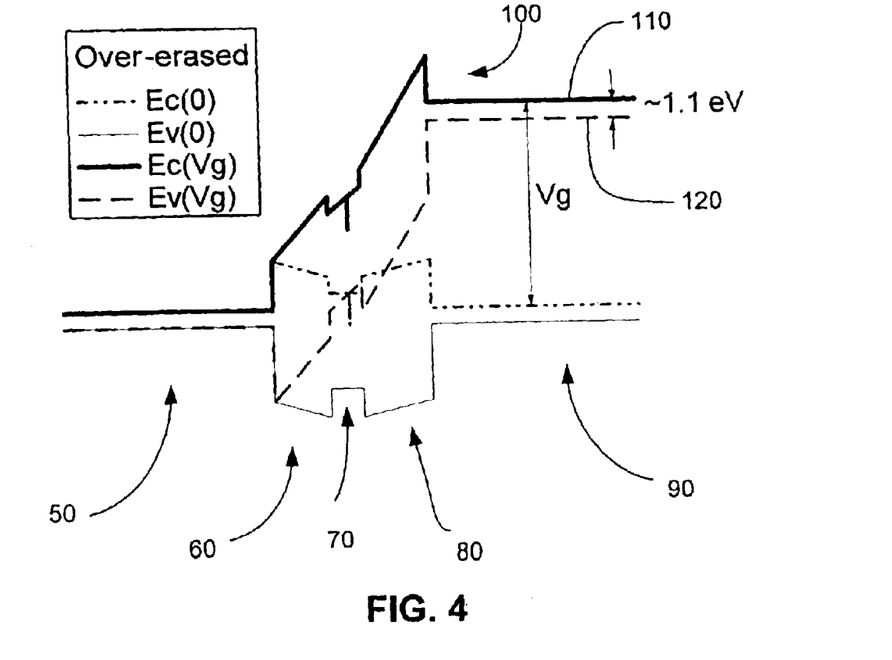
FIG. 4 is an over-erased state energy band diagram of a SONOS-type memory device having a P+ gate in accordance with one embodiment of the present invention.

FIGS. 2–4 represent energy band diagrams of neutral, programmed, and over-erased states, respectively, for a memory device having a P$^+$ gate electrode and a "thicker" (e.g., about 70 Å) bottom dielectric layer in accordance with one embodiment of the invention. Regions 50, 60, 70, 80, and 90 represent the substrate, bottom dielectric layer, charge storing layer, top dielectric layer, and gate electrode layer, respectively. The use of a P$^+$ gate electrode provides an increased barrier height (shown by triangular barrier 100), which prevents charge, in the form of electrons, from overcoming the barrier potential of the top dielectric layer 80 and tunneling into the charge storing layer during erase operations. It is to be appreciated that "barrier height," as used herein, refers to the size of the energy bandgap between the valence band and conduction band for a given material. This increased barrier height sufficiently minimizes, if not effectively prevents or otherwise "shuts off," back tunneling of electrons from the gate electrode, through the top dielectric layer, into the charge storing layer during a channel or FN erase operation.

In particular, with reference to FIG. 2, the energy level of the conduction band (Ec) 110 is approximately 1 eV (electron-volts) greater than the energy level of the valence band (Ev) 120 within the polysilicon gate electrode region 90. A conventional gate electrode having an N$^+$ dopant concentration is characterized by a fermi level, which is very close to the conduction band 110. For a memory device having an N$^+$ gate electrode, the size of the triangular barrier 100 is approximately 3.1 eV. In contrast, the gate electrode of the present invention has a P$^+$ dopant concentration, which is characterized by a fermi level just above the valence band 120. Therefore, for a memory device having a P$^+$ gate electrode, the size of the triangular barrier 100 is approximately 4.2 eV. While the approximately 1.1 eV difference in the height of the triangular barrier 100 for a P$^+$ gate electrode is significant, the effect on back tunneling current from the gate electrode to the charge storing layer is exceptional in light of the fact that the tunneling rate decreases exponentially with increasing barrier height. The increased barrier height, in turn, allows for a relatively large negative gate voltage of approximately −20 volts to be applied across the ONO stack to facilitate an FN channel erase operation in which both the normal bit and the complementary bit are effectively erased without encountering any back tunneling through the top dielectric layer.

Figure 5:
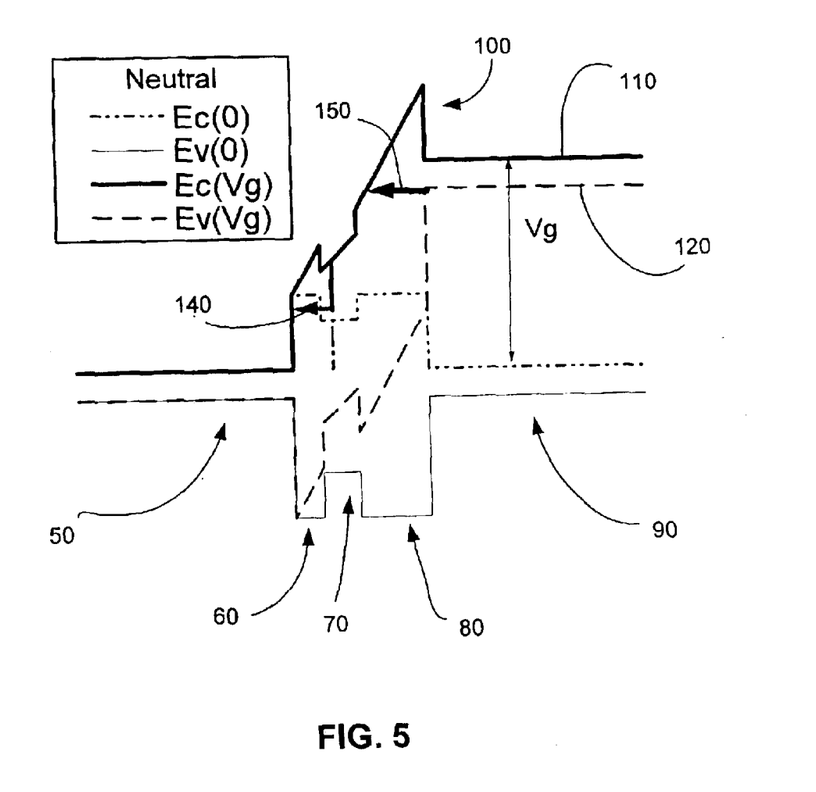
FIG. 5 is a neutral state energy band diagram of a SONOS-type memory device having a P+ gate and a reduced thickness bottom oxide in accordance with another embodiment of the present invention.
Figure 6:
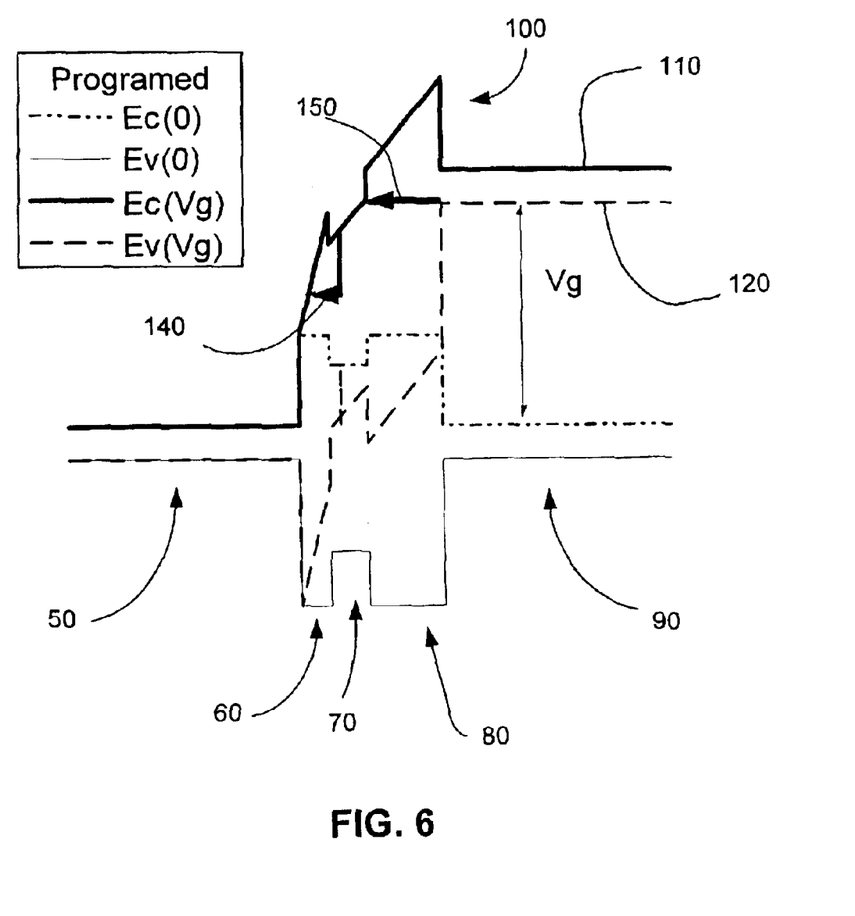
FIG. 6 is a programmed state energy band diagram of a SONOS-type memory device having a P+ gate and a reduced thickness bottom oxide in accordance with another embodiment of the present invention.

FIGS. 5 and 6 represent energy band diagrams of neutral and programmed states, respectively, for a memory device having a P$^+$ gate electrode and a thinner bottom dielectric layer (e.g., between about 40 Å–60 Å) in accordance with another embodiment of the invention. Again, regions 50, 60, 70, 80, and 90 represent the substrate, reduced thickness bottom dielectric layer, charge storing layer, top dielectric layer, and gate electrode layer, respectively. As discussed above, the P$^+$ gate electrode provides an increased barrier height (shown by triangular barrier 100), which effectively prevents back tunneling of electrons from the gate electrode, through the top dielectric layer, into the charge storing layer during a channel erase operation. In addition, the reduced thickness bottom layer is effective to increase the probability that during an erase operation, electrons within the charge storing layer will overcome a potential barrier of the bottom dielectric to exit the charge storing layer. In other words, the reduced thickness bottom dielectric layer provides a reduced barrier width, which, in turn, facilitates direct tunneling (represented by arrow 140) from the charge storing layer during a channel erase operation. Therefore, it is to be appreciated that the channel erase mechanism is a combination of FN tunneling (represented by arrow 150) and weak direct tunneling. In addition, the channel erase operation is effective to remove charge from the entire channel without the need for a tailored erase operation.

Figure 7:
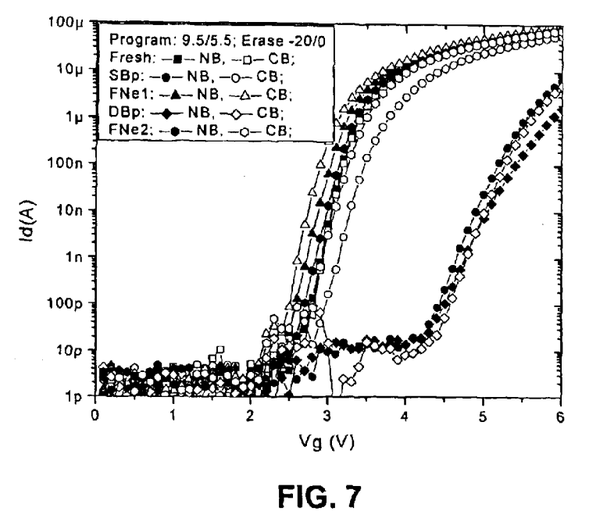
FIG. 7 is a plot of drain current vs. gate voltage for a plurality of channel erase operations performed on a SONOS-type memory device in accordance with the present invention.

FIG. 7 is a plot of the logarithm of drain current, Id(A), vs. gate voltage, Vg(V), on an exemplary device having a P$^+$ gate electrode for a plurality of program and erase operations, such as single-bit programming (SBp), double-bit programming (DBp), and FN erasing (FNe1, FNe2). Artisans will appreciate that the normal bit is represented by (NB), while the complementary bit is represented by (CB). In this embodiment, a gate program voltage of approximately 9.5 volts is used together with a voltage of approximately 5 volts applied to the drain. In addition, a negative gate erase voltage of approximately −20 volts is used, while the source, drain, and substrate are held at 0 volts.

Figure 8:
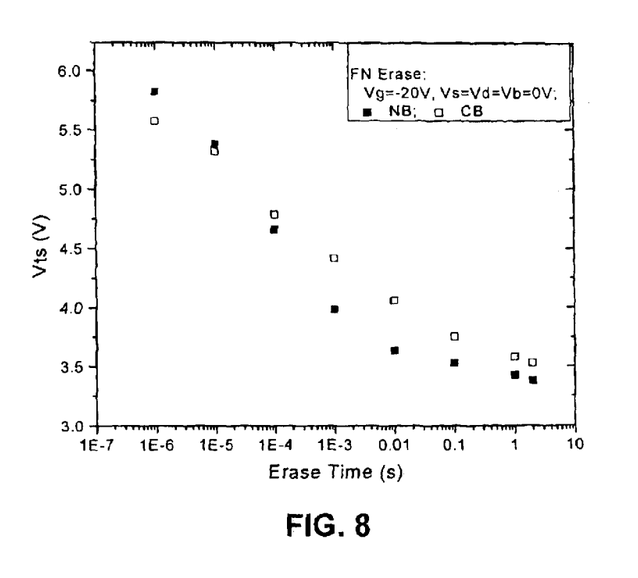
FIG. 8 is a plot of threshold voltage vs. erase time for both a normal bit and a complementary bit on a SONOS-type memory device in accordance with the present invention.

FIG. 8 is a plot of threshold voltage (Vt) vs. erase time (on log scale) for both the normal bit (NB) and complementary bit (CB) when a negative gate erase voltage is used. In this embodiment, the gate voltage Vg is approximately −20 volts, while the source, drain, and substrate are held at 0 volts. As shown in FIG. 8, it is possible to erase both bits with an erase pulse of approximately 100 ms (milliseconds), resulting in both cells being erased in approximately 1 second.

It is to be appreciated that the memory device of the present invention is efficient in erase operation and reliable in data retention up to at least 10,000 (10K) program-erase cycles.

With continued reference to FIG. 1, one method of fabricating the memory device 10 will be described in greater detail. As indicated, a semiconductor substrate 12 is provided. The semiconductor substrate 12 can be initially doped with P-type dopant, such as boron, gallium or indium. As indicated above, the initial substrate 12 doping can provide the desired conductivity for the body 18. Alternatively, an isolated P-well can be formed on the substrate, which allows for electrical bias to be applied to the isolated P-well during erase operation. In this embodiment, the memory device formed in the subsequent steps sits inside the isolated P-well.

A layer of material used to form the bottom dielectric layer 26 can be grown or deposited on top of the substrate 12. Preferably, the bottom dielectric layer will have a final thickness of about 40 Å to about 60 Å. As described above, the thickness of the bottom dielectric layer facilitates effective FN or channel erasing, while remaining thick enough to prevent low voltage leakage current during operations other than erasing, (e.g., programming, verifying, and reading), thereby maintaining desirable data retention. It is noted that the bottom dielectric layer can optionally be used as an implant screen during the implantation of dopant species into the substrate 12. In this instance, the bottom dielectric layer can be formed before initial substrate 12 implantation and/or source 14/drain 16 formation.

As indicated above, the bottom dielectric layer can be formed from an appropriate dielectric, such as silicon oxide. Following formation of the bottom dielectric layer, a layer of material used to form the charge storing layer 28 can be formed on the bottom dielectric layer 40. In one embodiment, the charge storing layer can be formed from silicon nitride. Other suitable dielectric materials may also be used for the charge storing layer 28. Preferably, the charge storing layer 28 has a final thickness of about 40 Å–70 Å.

On top of the charge storing layer 28, a top dielectric layer 30 can be formed. Similar to the bottom dielectric layer 26, the top dielectric layer 30 can be made from an appropriate dielectric, such as silicon oxide or a high-K material. High-K materials are materials having, in one embodiment, a relative permittivity of ten (10) or higher and, in another embodiment, of twenty (20) or higher. Suitable high-K materials include aluminum oxide (e.g., $Al_2O_3$), hafnium oxide (e.g., $HfO_2$), zirconium oxide (e.g., $ZrO_2$), and their respective silicates. However, the top dielectric layer 30 is thicker (i.e., about 100 Å–100 Å) than the bottom dielectric layer 26.

On top of the top dielectric layer 30, a gate electrode layer 32 can be formed. The gate electrode layer 32 can be made from, for example, polycrystalline silicon ("poly") or another appropriate material such as a metal or metal oxide. The gate electrode layer 32 is doped with P-type dopant, such as boron, gallium or indium.

Preferably, the gate electrode layer 32 has a "$P^+$" concentration. For example, the concentration can be about $1 \times e^{19}$ atoms/cm$^3$ to about $2 \times e^{21}$ atoms/cm$^3$. In one embodiment, boron ion species can be implanted with an energy of about 12 keV to about 40 keV and a dose of about $2 \times e^{15}$ atoms/cm$^2$ to about $4 \times e^{15}$ atoms/cm$^2$. As one skilled in the art will appreciate, the energy and dose can be adjusted for the specific memory device 10 being formed and taking into account the desired effects on programming and/or erasing of the memory device 10.

The sidewall spacers 35 and the deep doped regions, ff applicable, of the source 14 and the drain 16 can be formed. The sidewall spacers 35 can be formed adjacent the lateral sidewalls of the gate stack using conventional techniques. For example, a layer of desired spacer material (e.g., silicon oxide, silicon nitride, silicon oxynitride, etc.) can be deposited to at least the height of the gate stack 34. If desired, the spacer material can be polished (using, for example, chemical mechanical planarization, or CMP) back to an upper surface of the gate electrode 32. Then, the spacer material can be anisotropically etched so that the sidewall spacers 35 remain.

Thereafter, any additional processing to complete formation of the memory device 10 can be carded out. For example, the source 14, the drain 16 and the gate electrode 32 can be reacted with a layer of metal (e.g., cobalt, nickel, molybdenum or titanium) to form silicide contacts (not shown). In addition, various interdielectric layers (not shown) can be formed over the memory device 10. With additional reference back to FIG. 1, the bit lines (e.g., BL1 and BL2) and the word line (e.g., WL) can be formed between interdielectric layers. The bit lines BL1 and BL2 can be respectively coupled to the source 14 and the drain 16 contacts with filled contact holes (e.g., vias) (not shown). Similarly, the word line WL can be coupled to the gate electrode 32 with a filled contact hole (e.g., a via) (not shown).

Although particular embodiments of the invention have been described in detail, it is understood that the invention is not limited correspondingly in scope, but includes all changes, modifications and equivalents coming within the spirit and terms of the claims appended hereto.

For example, the source 14 and drain 16 could be formed by techniques other than implanting dopant species. For instance, these regions can be in-situ doped during an epitaxial growth process.

What is claimed is:

1. A method of performing an erase operation on a non-volatile memory cell having a $N^+$ source and an $N^+$ drain within a substrate, a bottom oxide layer on a top surface of the substrate, a charge storing layer on the bottom oxide layer, a top oxide layer on the charge storing layer, and a $P^+$ polysilicon gate electrode on the top oxide, the memory device having been programmed by storing charge in a portion of the charge storing layer adjacent the source, the method comprising the simultaneous steps of:
    applying a negative erase voltage to the gate electrode;
    one of (i) connecting the drain to a zero potential, and (ii) floating the drain;
    one of (i) connecting the source to a zero potential and (ii) floating the source; and
    connecting the substrate to a zero potential.

2. The method according to claim 1, wherein the simultaneous steps occur for a duration of at least about 100 ms.

3. The method according to claim 2, wherein the erase voltage applied to the gate is in a range of about –10 volts to about –20 volts.

4. The method according to claim 2, wherein the erase voltage applied to the gate is less than about –20 volts.

5. The method according to claim 2, wherein the duration is less than about 1 sec.

6. The method according to claim 1, wherein the charge storing layer includes two bits, both bits being erased simultaneously.

7. A method of simultaneously erasing two charge storing cells on a non-volatile memory device having an $N^+$ source and an $N^+$ drain within a P-type substrate, an oxide-nitride-oxide (ONO) stack on a top surface of the substrate, said charge storing cells being disposed within the nitride layer of the ONO stack, and a gate layer on the ONO stack, said method comprising:
    increasing a potential barrier height of the top oxide of the ONO stack, said increased potential barrier height being effective to decrease the probability that, during an erase operation, electrons within the gate layer will overcome a potential barrier of the top oxide and become trapped in the charge storing cells of the nitride layer;
    decreasing a barrier width of the bottom oxide of the ONO stack, said decreased barrier width being effective to (i)

increase the probability that, during an erase operation, electrons within the charge storing cells of the nitride layer will overcome a potential barrier of the bottom oxide to exit the charge storing cells, and (ii) decrease the probability that, during operations other than an erase operation, charge will overcome a potential barrier of the bottom oxide and escape from the charge storing cells;

applying a negative erase voltage of less than about −20 volts to the gate layer;

one of (i) applying a zero potential to the source, and (ii) floating the source;

one of (i) applying a zero potential to the drain, and (ii) floating the drain; and applying a zero potential to the substrate.

8. The method according to claim 7, wherein increasing the potential barrier height includes:

heavily doping the gate layer to provide P$^+$ conductivity.

9. The method according to claim 8, wherein decreasing the barrier width includes:

decreasing the thickness of the bottom oxide layer to between about 40 Å and about 60 Å.

* * * * *

UNITED STATES PATENT AND TRADEMARK OFFICE
CERTIFICATE OF CORRECTION

PATENT NO. : 6,885,590 B1
DATED : April 26, 2005
INVENTOR(S) : Zheng et al.

It is certified that error appears in the above-identified patent and that said Letters Patent is hereby corrected as shown below:

Column 1,
Line 15, replace "modem" with -- modern --.

Column 9,
Line 29, replace "about 100 Å-100 Å" with -- 100 Å-110Å --.
Line 47, replace "ff" with -- if --.
Line 60, replace "carded" with -- carried --.

Signed and Sealed this

Twenty-eighth Day of June, 2005

JON W. DUDAS
*Director of the United States Patent and Trademark Office*